United States Patent [19]
Miyazaki

[11] Patent Number: 5,946,702
[45] Date of Patent: Aug. 31, 1999

[54] DOCUMENT INFORMATION TRANSMITTING, RECEIVING AND PROCESSING APPARATUS AND METHOD FOR COMPENSATING CHARACTER DISPLAY

[75] Inventor: Toshiya Miyazaki, Kawasaki, Japan

[73] Assignee: Fujitsu Limited, Kawasaki, Japan

[21] Appl. No.: 08/857,266

[22] Filed: May 16, 1997

[30] Foreign Application Priority Data

Oct. 29, 1996 [JP] Japan .................................. 8-286658

[51] Int. Cl.$^6$ .................................................. G06F 17/28
[52] U.S. Cl. ........................................ 707/531; 707/526
[58] Field of Search ........................... 345/439; 707/500, 707/517, 526, 523, 530, 531, 540, 906, 911, 501, 534; 704/2, 4, 3, 9, 1; 395/200.76; 179/28

[56] References Cited

U.S. PATENT DOCUMENTS

| | | | |
|---|---|---|---|
| 4,511,758 | 4/1985 | Konishi et al. | 179/2 B |
| 5,295,068 | 3/1994 | Nishino et al. | 704/2 |
| 5,548,508 | 8/1996 | Nagami | 704/2 |
| 5,638,543 | 6/1997 | Pedersen et al. | 704/1 |
| 5,708,825 | 1/1998 | Sotomayor | 707/501 |
| 5,727,159 | 3/1998 | Kikinis | 395/200.76 |

OTHER PUBLICATIONS

The William Group, The Complete Index of HTML Tags: Comprehensive HTML Cross Reference, The Willcam Group Limited, pp. 1–8.

*Primary Examiner*—Frank J. Asta
*Assistant Examiner*—Patrice L. Winder
*Attorney, Agent, or Firm*—Staas & Halsey LLP

[57] ABSTRACT

There is provided a document information transmitting apparatus and a document information receiving apparatus in a communication system having the document information transmitting apparatus for transmitting document information and the document information receiving apparatus for receiving and displaying document information, said document information transmitting apparatus and said document information receiving apparatus being connected to each other through a communication line, and a document information processing apparatus for processing document information regardless of the fact that the document information processing apparatus constitutes communication systems. At the transmitter end, a simplification possible character string is detected from among document information, and a control statement is inserted into the document information in association with the detected simplification possible character string. At the receiver end, simplified statements are generated and displayed referring to the control statement.

6 Claims, 8 Drawing Sheets

ORIGINAL : 「構内の撮影は、固く禁じられています。」

(a) SIMPLIFIED SENTENCE : 「構内撮影は、固く禁止」
    (LITTLE IN DEGREE OF SIMPLIFICATION)

(b) SIMPLIFIED SENTENCE : 「撮影は、禁止」
    (GREAT IN DEGREE OF SIMPLIFICATION)

(a) 構内<D>の<!D>撮影は、固く<CONV:001>禁じられています。<!CONV>
(b) <D>構内の<!D>撮影は、<D>固く<!D><CONV:001>禁じられています。<!CONV>

001:禁止

<H> 構内<L> の<!L><!H>撮影は、<H> 固く<!H><CONV:001>禁じられています。<!CONV>

<CONV:002>構内の撮影は、固く禁じられています。<!CONV>

0 0 2 :

# DOCUMENT INFORMATION TRANSMITTING, RECEIVING AND PROCESSING APPARATUS AND METHOD FOR COMPENSATING CHARACTER DISPLAY

BACKGROUND OF THE INVENTION

1. Field of the Invention

The present invention relates to a document information transmitting apparatus and a document information receiving apparatus in a communication system having the document information transmitting apparatus for transmitting document information and the document information receiving apparatus for receiving and displaying document information, said document information transmitting apparatus and said document information receiving apparatus being connected to each other through a communication line, and a document information processing apparatus for processing document information regardless of the fact that the document information processing apparatus constitutes communication systems.

2. Description of the Related Art

Recently, there has been provided a computer network, with a server/client technology as a leading part, which makes it possible to access to a desired information source (server) anywhere in the world if it is accessible to a network having an information processing unit which is utilized as a client.

Specifically, recently, there has been established a world scale interactive service technology referred to as a WWW (World Wide Web), which is known as the most convenient technique for obtaining any character information or image information.

According to the WWW technology, an HTML (Hyper Text Markup Language) document, which is put into a sentence, is transferred between a server and a client under a suitable transfer, wherein a request and a response are adopted in the form of the basic mode, and at the client end, a suitable display means (browser) is used to display portions except tags of the transmitted HTML document, that is, the original sentence or the original image.

On a screen of the client end, it is possible to designate various portions in the sentence by a pointer such as a mouse or the like. When such a designation is performed, the designated portion starts the associated work on the basis of the function of the associated tag.

For example, in a case where there is displayed a word associated with an address of another computer on a network in a sentence, and the associated tag has a statement such that "login as to a computer of the address", simply designating the word with the pointer by the user implements a work up to the login as to the computer.

In addition, it should be noticed that as a network environment develops, there appears a concept such as a "moving type of terminal", and also computers are miniaturized, so that it becomes easy to obtain information at any place.

However, it is the actual state that the current information transmission service does not consider circumstances of the receiver end. As the most important one of the circumstances of the receiver end, there is raised a "display capacity of a screen", that is, the number of characters which is permitted to be displayed at a time.

Nowadays, there appears an operation system of a window system. Such an operation system permits a part could not be displayed on a screen at a time to be displayed on the screen by scrolling sentences in the screen by means of scrolling. However, there are not so few information processing apparatuses having no window system as mentioned above or the screen scrolling function. Further, it is noted that even if the information processing apparatus has the screen scrolling function, it is preferable to display simultaneously information messages as many as possible on a screen.

For these reasons, there is raised a need such that an information processing apparatus, which is available for a communication but poor in a display capacity (the number of characters permitted to be displayed at a time is few), can accept an information content in the same degree as an information processing apparatus having a large display capacity.

SUMMARY OF THE INVENTION

In view of the foregoing, it is therefore an object of the present invention to provide a document information transmitting apparatus, a document information receiving apparatus and a document information processing apparatus each having such a function that when document information is displayed, in the event that a character display capacity at the receiver end or a character display capacity of one's own self is poor, the poor character display capacity is compensated.

FIG. 1 is a principle block diagram of a document information transmitting apparatus according to the present invention.

There is provided a document information transmitting apparatus in a communication system having the document information transmitting apparatus for a transmission of document information and a document information receiving apparatus for receiving and displaying document information, said document information transmitting apparatus and said document information receiving apparatus being connected to each other through a communication line. The document information transmitting apparatus comprises:

a simplification possible portion detection unit 101 for detecting a portion, which can be simplified in sentence, of the document information, in accordance with meaning of sentences represented by the document information;

a control statement insertion unit 102 for inserting into the document information a control statement indicating a possible simplification in association with the portion, which can be simplified in sentence, of the document information; and a transmitter unit 103 for transmitting the document information including the control statement.

According to the document information transmitting apparatus of the present invention, a portion, which can be simplified in sentence, of document information is detected; a control statement indicating a possible simplification is inserted into the document information in association with the portion, which can be simplified in sentence, of the document information; and the document information including the control statement is transmitted. This feature allows a document information receiving apparatus received such document information to for example display the original as it is in accordance with one's own display capacity in disregard of the control statement, alternatively in the event that the display capacity of the display unit is poor, to display the simplified statement in which a portion, which can be simplified in sentence, of document information is simplified in accordance with the control statement. Thus, even in the event that the display capacity is poor, it is possible to display document information without substantially degrading an amount of information.

In the document information transmitting apparatus as mentioned above, it is preferable that the document information transmitting apparatus further comprises a simplification mode selection unit 104 for optionally selecting one of a plurality of simplification modes mutually different in degree of simplification. In this case, said simplification possible portion detection unit 101 detects the portion, which can be simplified in sentence, of the document information, in accordance with the simplification mode selected by said simplification mode selection unit 104.

The provision of the simplification mode selection unit 104 in the document information transmitting apparatus mentioned above makes it possible to select a degree of the simplification to meet a display capacity of the document information receiving apparatus to which the document information is directed. As to the selection between the plurality of simplification modes, it is acceptable to leave it to an operator of the document information transmitting apparatus, alternatively to previously store a list of display capacity of document information receiving apparatuses. Further, as will be described, it is acceptable to inquire of a receiver end of interest about the display capacity of the receiver end.

In the document information transmitting apparatus mentioned above, it is preferable that the document information transmitting apparatus further comprises a display capacity inquiry unit 105 for inquiring of the document information receiving apparatus of interest about its character display capacity. In this case, said simplification mode selection unit 104 selects, upon receipt of a response of the document information receiving apparatus of interest to inquiry of its character display capacity from said display capacity inquiry unit 105, the simplification mode according to the character display capacity of the document information receiving apparatus of interest.

This feature makes it possible to adaptively select the suitable simplification mode according to the character display capacity of the document information receiving apparatus of interest, even in the event that the display capacity is varied in accordance with the situation, for example, in a case where a plurality of display windows are opened on a display screen of the receiver end.

FIG. 2 is a principle block diagram of a document information receiving apparatus according to the present invention.

There is provided a document information receiving apparatus in a communication system having the document information transmitting apparatus for a transmission of document information and a document information receiving apparatus for receiving and displaying document information, said document information transmitting apparatus and said document information receiving apparatus being connected to each other through a communication line. Said document information receiving apparatus comprises:

a receiver unit 201 for receiving document information including a control statement indicating a possible simplification in association with a portion, which can be simplified in sentence, of the document information;

a simplification information generating unit 202 for generating simplification information in accordance with the document information including the control statement received with said receiver unit, said simplification information being simplified in the portion, which can be simplified in sentence, represented by the control statement; and a display unit 203, having a display screen 203a, for displaying on the display screen 203a the simplification information generated by said simplification information generating unit 202.

According to the document information receiving apparatus of the present invention, document information including a control statement indicating a possible simplification is received in association with a portion, which can be simplified in sentence, of the document information; simplification information is generated in accordance with the document information including the control statement received, said simplification information being simplified in the portion, which can be simplified in sentence, represented by the control statement; and the simplification information thus generated is displayed. This feature makes it possible to substantially prevent degradation of an amount of display information, even in the event that the character display capacity of the document information receiving apparatus is poor.

In the document information receiving apparatus mentioned above, it is preferable that the document information receiving apparatus further comprises:

an original information generating unit 204 for generating original information in which the control statement is removed from the document information including the control statement received with said receiver unit 201; and an information selecting unit 205 for selecting either the simplification information generated by said simplification information generating unit 202 or the original information generated by said original information generating unit 204. In this case, said display unit 203 displays on the display screen 203a the simplification information selected by said information selecting unit 205.

This feature makes it possible to for example grasp document information in its entirety through displaying the simplified information and know the details of the document information through displaying the original information.

Further, in the document information receiving apparatus mentioned above, it is preferable that the document information receiving apparatus further comprises a handler 206 for indicating a position on the display screen 203a of said display unit 203. The handler 206 is, for example, a mouse, track ball and the like. In this case, said information selecting unit 205 is adapted to select either the simplification information or the original information every partial information mutually associated with each other in such a manner that when a display position, on the display screen, of the partial information simplified in the simplification information is indicated by said handler 206, said information selecting unit selects partial information of the original information associated with the partial information simplified in the simplification information instead of the partial information simplified in the simplification information.

This feature makes it possible to implement a display mode in which a correspondence between simplified partial information and detail information meant by the simplified partial information is readily interpreted.

FIG. 3 is a principle block diagram of a document information processing apparatus according to the present invention.

There is provided a document information processing apparatus comprising:

a simplification possible portion detection unit 301 for detecting a portion, which can be simplified in sentence, of document information, in accordance with meaning of sentences represented by the document information;

a simplification information generating unit 302 for generating simplification information simplified in the portion, which can be simplified in sentence, of document information, detected by said simplification possible portion detection unit 301; and a display unit 303, having a display screen 303a, for displaying on the display screen the simplification information generated by said simplification information generating unit 302.

The document information processing apparatus according to the present invention is an aspect in the event that document information is displayed on a display unit of one's own self, including such a case where the document information transmitting apparatus mentioned above displays information on a display unit of its own self, such a case where the document information transmitting apparatus receives document information in the form of the original including no the above-mentioned control statement and displays information on a display unit of its own self in accordance with the document information in the form of the original, and such a case where information is displayed on a display unit of one's own self independently of a communication system.

According to the document information processing apparatus according to the present invention, it is possible to implement a display scheme in which an amount of information is substantially ensured in display, even in the event that a character display capacity of one's own self is poor.

DESCRIPTION OF THE PREFERRED EMBODIMENTS

Hereinafter, there will be described embodiments of the present invention.

Figure 4:
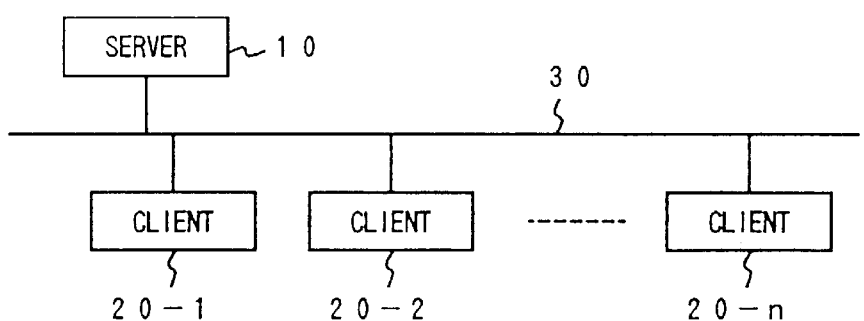
FIG. 4 is a schematic construction view of a communication system according to one embodiment of the present invention.

FIG. 4 is a schematic construction view of a communication system according to one embodiment of the present invention.

The communication system shown in FIG. 4 comprises a server 10 and a plurality of clients 20_1, 20_2, . . . , 20_n. They are coupled with each other via a communication line 30. The server 10 transmits, upon receipt of a transmission request of document information from anyone of the clients, the document information according to the transmission request to a client who made the transmission request. The server 10 is a one embodiment of a document information transmitting apparatus referred to in the present invention. Each of the clients 20_1, 20_2, . . . , 20_n may request the server 10 to transmit document information, and upon receipt of the document information transmitted, display on a display unit of one's own self information generated on the basis of the document information. Each of the clients 20_1, 20_2, . . . , 20_n is a one embodiment of a document information receiving apparatus referred to in the present invention.

Figures 5, 6, 7:
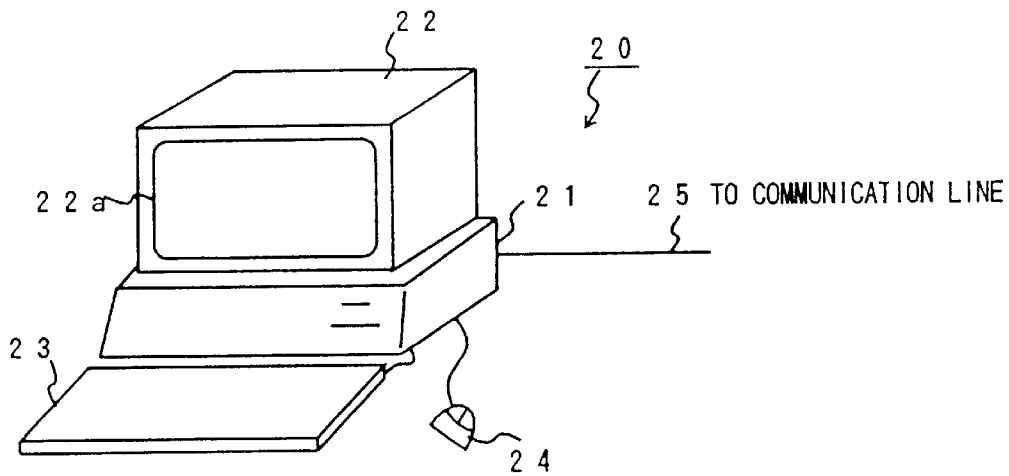
FIG. 5 is a perspective illustration of computer system corresponding to a client shown in FIG. 4.
FIG. 6 is an illustration in which document information (original) before processing and two kinds of document information (simplified sentences) after processing are exemplarily shown.
FIG. 7 is an illustration in which document information including control sentences is exemplarily shown.

FIG. 5 is a perspective illustration of computer system corresponding to a client shown in FIG. 4.

The computer system 20 comprises a main frame 21 which incorporates therein a CPU, a magnetic disc unit and the like not illustrated, a display unit 22 having a display screen 22a, a keyboard 23 and a mouse 24 which serves as a handler referred to in the present invention. The computer system 20 is connected via a communication cable 25 to the communication line 30 (cf. FIG. 4).

Next, there will be described an information processing executed in the communication system shown in FIG. 4.

FIG. 6 is an illustration in which document information (original) before processing and two kinds of document information (simplified sentences) after processing are exemplarily shown.

The original is involved in, for example, the Japanese sentence ("photography in the grounds is strictly prohibited"). The server 10 analyzes the original on the basis of meaning of the sentence of the original. At the client end, there is displayed a simplified sentence (a), such as ("photography in grounds strictly prohibited"), which is little in degree of simplification, or a simplified sentence (b), such as ("photography prohibited"), which is great in degree of simplification.

FIG. 7 is an illustration in which document information including control sentences is exemplarily shown.

Parts (a) and (b) of FIG. 7 correspond to the simplified sentences of the parts (a) and (b) of FIG. 6, respectively.

Control characters <D> and <!D> are used in a pair, and implies that characters or a character string sandwiched between the control characters <D> and <!D> can be omitted. Also control characters <CONV: XXX> and <!CONV> are used in a pair, and implies that characters or a character string sandwiched between the control characters <CONV: XXX> and <!CONV> can be replaced by another characters or another character string. A "document information transmitting apparatus X3" of <CONV: XXX> implies a number of a character or a character string to be inserted instead of characters or a character string sandwiched between the control characters <CONV: XXX> and <!CONV>.

In case of the communication system shown in FIG. 4, the server 10 and each of the clients 20_1, 20_2, . . . , 20_n have in common a corresponding list between a number of a character or a character string and the associated character or the associated character string.

When the server 10 analyzes the sentence of the original shown in FIG. 6 and detects parts permissible in simplification (including both "omission" and "replacement") in accordance with a sentence analyzing result, the server 10 inserts the control sentences into the document information as shown in the parts (a) or (b) of FIG. 7 and transmits the document information including the control sentences to a client. The client omits characters or a character string sandwiched between the control characters <D> and <!D> from the document information including the control sentence transmitted, and replaces characters or a character string sandwiched between the control characters <CONV: XXX> and <!CONV> by characters or a character string corresponding to a number XXX, thereby producing and displaying the simplified sentences as shown in the parts (a) or (b) of FIG. 6.

It is selected in view of, for example, a character display capacity of the client as to whether the control sentences are inserted as shown in the part (a) of FIG. 7 or the part (b) of FIG. 7.

Figures 8, 9:
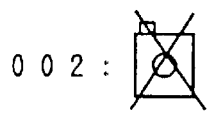
FIG. 8 is an illustration showing another example in which document information includes control sentences.
FIG. 9 is an illustration showing further another example in which document information includes control sentences.

FIG. 8 is an illustration showing another example in which document information includes control sentences.

Here, as control sentences indicating that characters or a character string sandwiched therebetween can be omitted, there are adopted a control sentence comprising control characters <H> and <!H> used in a pair, and a control sentence comprising control characters <L> and <!L> used in a pair. A client end displays a simplified sentence in accordance with a character display capacity of the client's own in such a manner that when the display capacity is relatively high, a pair of <L> and <!L> is adopted neglecting a pair of <H> and <!H>, so that a simplified sentence shown in the part (a) of FIG. 6, which is little in degree of simplification, is displayed, and on the other hand, when the display capacity is relatively low, a pair of <H> and <!H> is adopted neglecting a pair of <L> and <!L>, so that a simplified sentence shown in the part (b) of FIG. 6, which is great in degree of simplification, is displayed.

As described above, it is acceptable that the control sentences having a plurality of criterions for a degree of simplification are simultaneously included into a single document information message.

FIG. 9 is an illustration showing further another example in which document information includes control sentences.

Here, the original document is sandwiched between control sentences comprising control characters <CONV: 002> and <!CONV>. The number 002 indicates ("no photograph") as illustrated, which corresponds to the illustration in which a mark X is applied to a camera. The whole original is replaced by such an illustration. In this manner, it is acceptable that the original is replaced by not only characters, but also illustrations which cause clients to guess a meaning of the sentence.

Hereinafter, there will be described internal functions of the server and the client.

Figure 10:
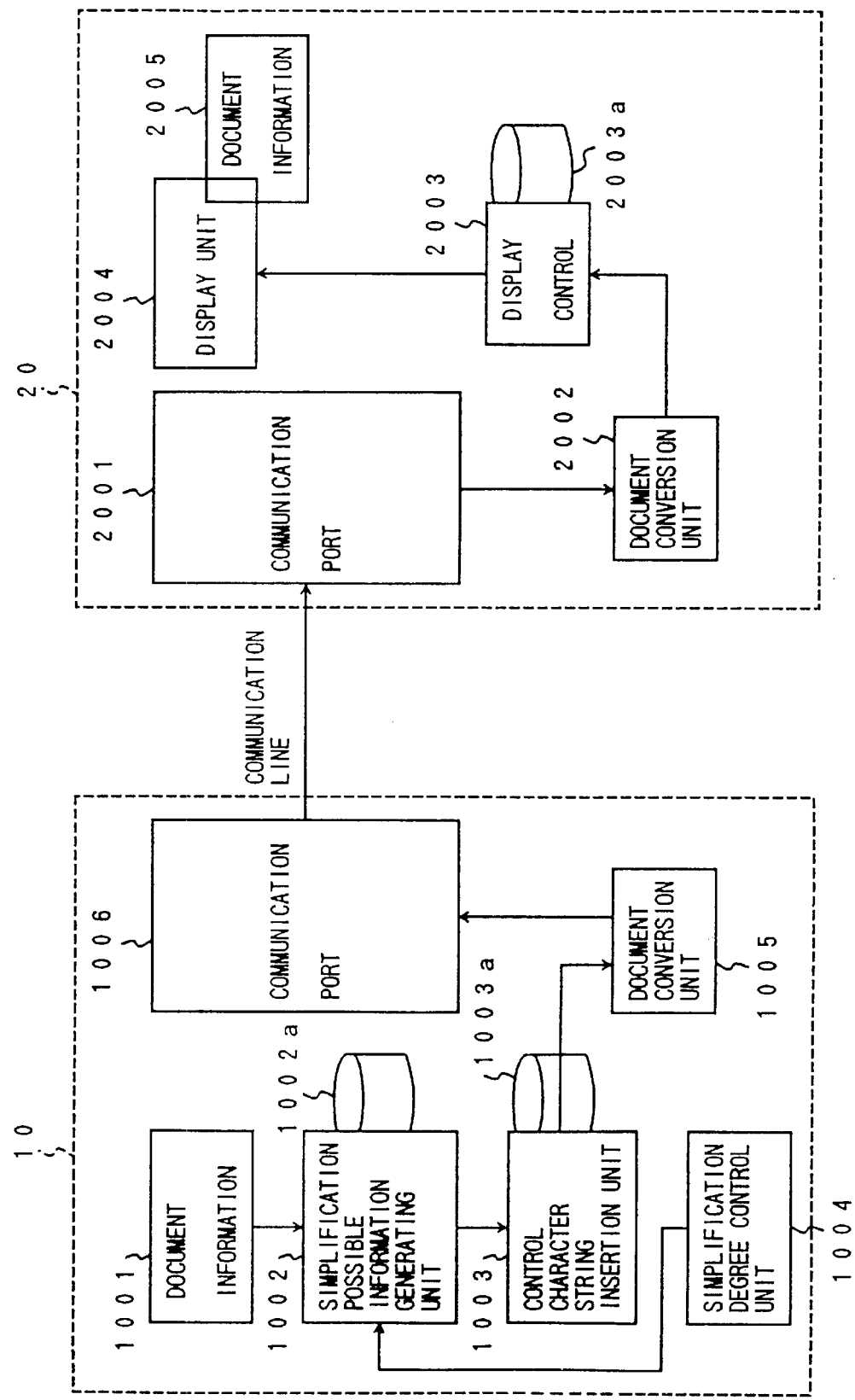
FIG. 10 is a functional block diagram of a server and a client.
Figure 11:
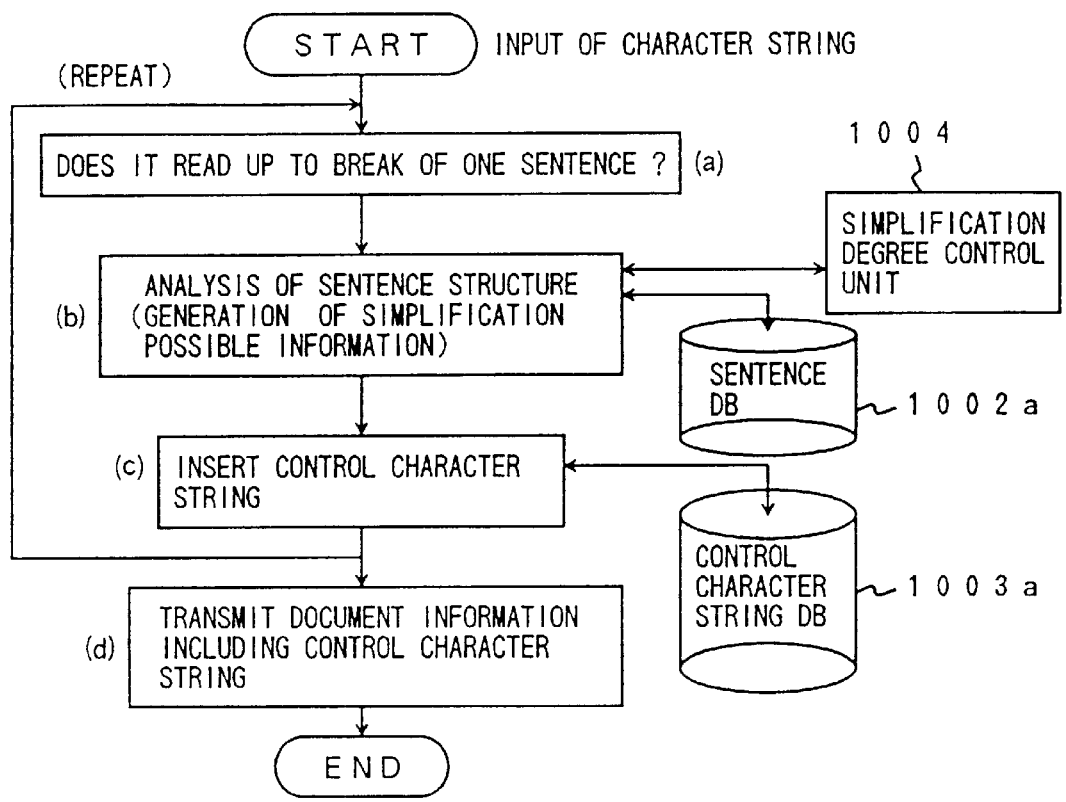
FIG. 11 is a flowchart useful for understanding an operation of the server.
Figure 12:
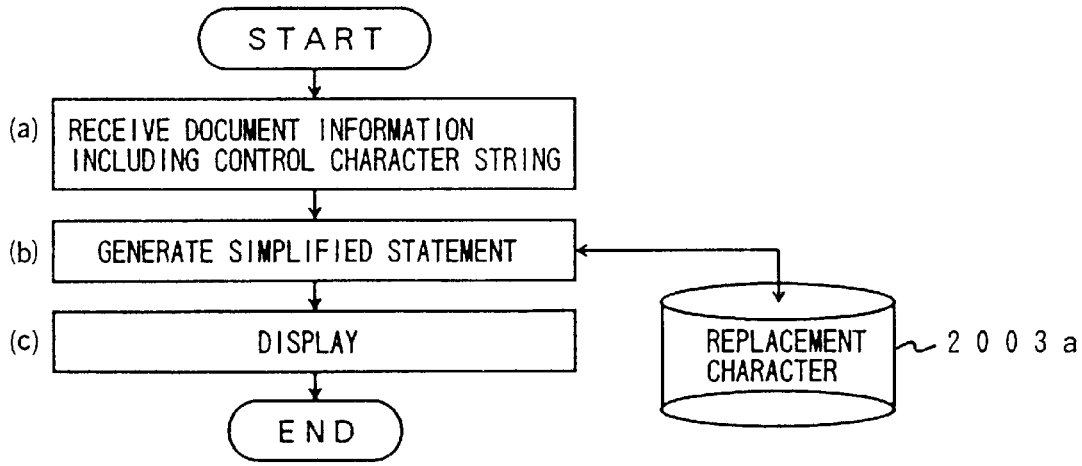
FIG. 12 is a flowchart useful for understanding an operation of the client.

FIG. 10 is a functional block diagram of a server and a client, FIG. 11 is a flowchart useful for understanding an operation of the server, and FIG. 12 is a flowchart useful for understanding an operation of the client.

The server 10 stores document information 1001. A simplification possible information generating unit 1002 reads the document information 1001 up to a break of punctuation marks or the like (step (a) in FIG. 11). In case of the original shown in FIG. 6, for example, the subject such as ("photography in the grounds") is read, and after a processing, which will be described later, is executed, the predicative such as ("is strictly prohibited") is read.

The simplification possible information generating unit 1002 analyzes the sentence structure of the character string thus read to generate simplification possible information (step (b) in FIG. 11). When the simplification possible information is generated, a simplification degree control unit 1004 indicates a degree of simplification.

For example, in case of the example shown in FIG. 6, there is generated simplification possible information'such that in the event that the degree of simplification is little, ("in") in ("photography in the grounds") can be omitted; in the event that the degree of simplification is great, ("in") in ("photography in the grounds") and ("strictly") in ("is strictly prohibited") can be omitted; and further ("is prohibited") can be replaced by ("prohibited") regardless of the magnitude of a degree of the simplification.

Such an analysis can be implemented using a known sentence structure analysis algorithm and a text data base 1002a including various types of sentences and meanings of a sentence.

Figure 1:
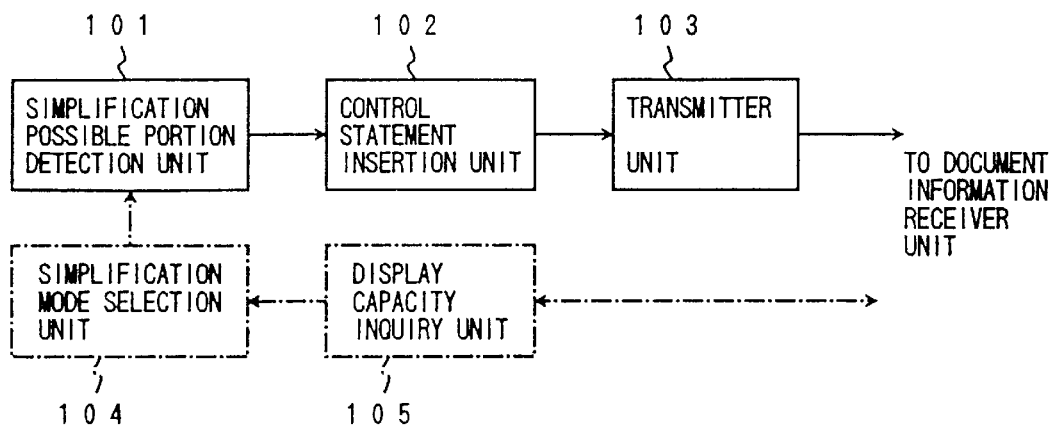
FIG. 1 is a principle block diagram of a document information transmitting apparatus according to the present invention.
Figure 2:
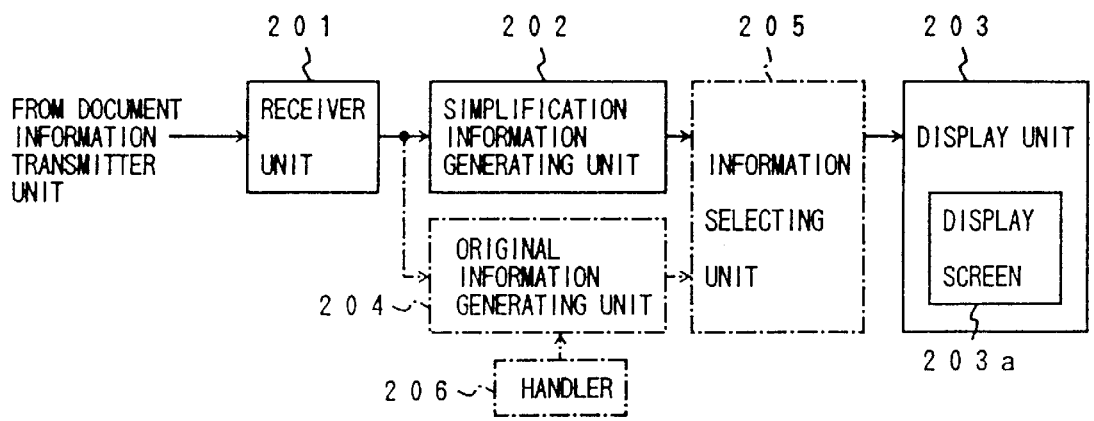
FIG. 2 is a principle block diagram of a document information receiving apparatus according to the present invention.
Figure 3:
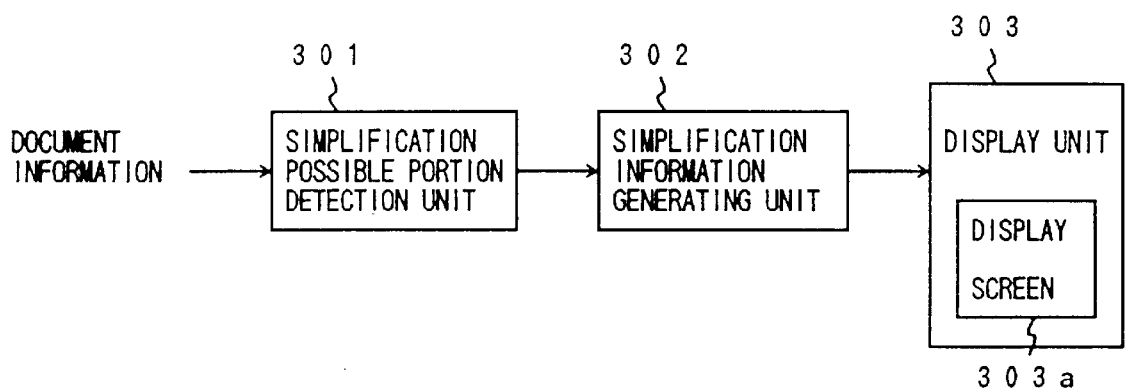
FIG. 3 is a principle block diagram of a document information processing apparatus according to the present invention.

Incidentally, the simplification possible information generating unit 1002 corresponds to the simplification possible portion detection unit 101 (FIG. 1) referred to in the present invention.

Next, in a control character string insertion unit 1003, the control character strings as shown in FIG. 7 are inserted into the document information 1001 (step (c) in FIG. 11). When the control character strings are inserted, a control character string data base 1003a is referred to. The control character string insertion unit 1003 corresponds to the control statement insertion unit 102.

Steps (a) to (c) are repeated, so that the control character strings are inserted throughout document information to be transmitted. The document information thus inserted with the control character strings is converted by a document conversion unit 1005 into data row suitable for the protocol determined in this communication system, and is transferred via a communication port 1006 (step (d) in FIG. 11). Where the combination of the document conversion unit 1005 and the communication port 1006 corresponds to the transmitter unit 103 referred to in the present invention.

In client 20, a communication port 2001 receives data train transmitted via a communication line, and a document conversion unit 2002 restores the data train to the document information before the conversion by the document conversion unit 1005 into the character string for a communication (step (a) in FIG. 12). The document information thus restored is fed to a display control unit 2003. The combination of the communication port 2001 and the document conversion unit 2002 corresponds to the receiver unit 201 referred to in the present invention. The display control unit 2003 corresponds to the simplification information generating unit 202 referred to in the present invention, or according to the situation, to the combination of the simplification information generating unit 202, the original information generating unit 204 and the information selecting unit 205.

The display control unit 2003 refers to the control character string inserted in the document information transmitted, and, further refer to, if necessary, a replacement character data base 2003a in which the corresponding table of the number in the control characters to the character string is stored, so as to generate, for example, the simplified statement as shown in parts (a) or (b) of FIG. 6 (step (b) in FIG. 12). The simplified statement thus generated is transferred to a display unit 2004. The display unit 2004 displays the transmitted document information 2005 on its display screen (cf. the display screen 22a shown in FIG. 5) (step (c) in FIG. 12).

Figure 13:
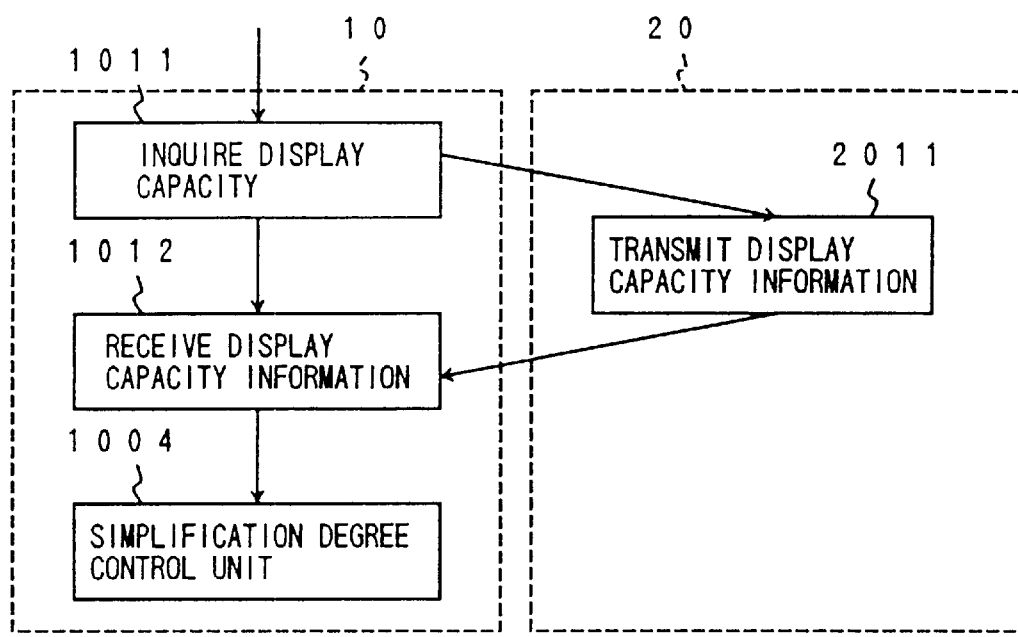
FIG. 13 is a functional block diagram of a part to be added to the embodiment shown in FIG. 10, according to another embodiment of a document information transmitting apparatus and a document information receiving apparatus of the present invention.

FIG. 13 is a functional block diagram of a part which is to be added to the embodiment shown in FIG. 10, according to another embodiment of a document information transmitting apparatus and a document information receiving apparatus of the present invention.

The server 10 inquires of the client 20 about its display capacity (step 1011). In response to the inquiry of the server 10, the client 20 transmits to the server 10 display capacity information representative of a display capacity of its own self (step 2011).

Upon receipt of the display capacity information, the server 10 transfers the display capacity information to the simplification degree control unit 1004. The simplification degree control unit 1004 instructs the simplification possible information generating unit 1002 a degree of simplification in accordance with the display capacity.

In this manner, the simplification is performed in accordance with the display capacity or ability of the client 20.

Figure 14:
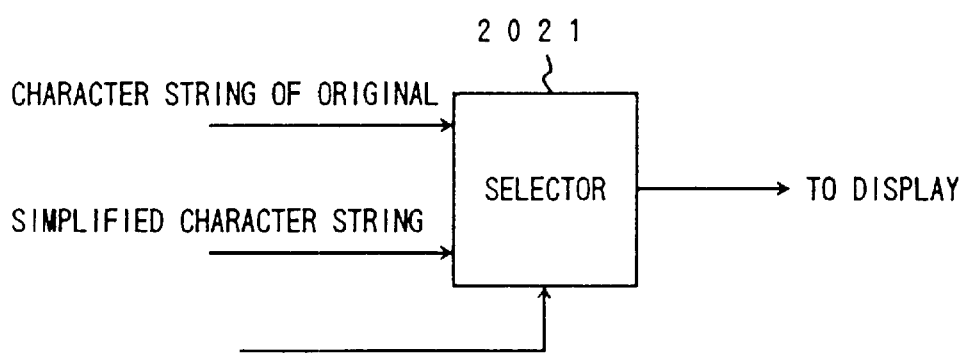
FIG. 14 is a functional block diagram of a part to be added to the embodiment shown in FIG. 10, according to further another embodiment of a document information transmitting apparatus of the present invention.

FIG. 14 is a functional block diagram of a part to be added to the embodiment shown in FIG. 10, according to further another embodiment of a document information transmitting apparatus of the present invention.

In the display control unit 2003 of the client 20 shown in FIG. 10, for example, both the original and the simplified statements-as shown in FIG. 6 are generated in accordance with the document information including the control character string. Either of the original and the simplified statement is selected by a selector 2021 in accordance with an operation of the keyboard 23 (cf. FIG. 5) by an operator of the client 20, for example. The selected one of the original and the simplified statement is transferred to the display unit. Thus, the selective display between the original and the simplified statement at the client 20 end makes it possible to grasp the meaning of a sentence in its entirety through the simplified statement and to confirm the details of the sentence through the original.

Figure 15:
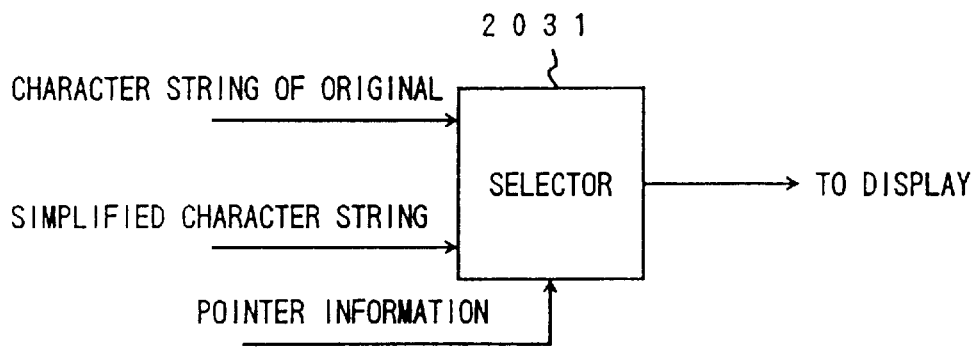
FIG. 15 is a functional block diagram of a part to be added to the embodiment shown in FIG. 10, according to still further another embodiment of a document information transmitting apparatus of the present invention.

FIG. 15 is a functional block diagram of a part which is to be added to the embodiment shown in FIG. 10, according to still further another embodiment of a document information transmitting apparatus of the present invention.

In the condition that the simplified character string is displayed on the display screen 22a (cf. FIG. 5), the mouse 24 shown in FIG. 5 is operated to click the simplified character display portion on the display screen 22a. As a result, the pointer information is inputted to a selector 2031, whereby only the portion subjected to the click operation is replaced in display by the character string of the original partially selected. The use of the selector 2031 for a partial changing over as to only the indicated portion but not a changing over as to the original and the simplified statement on a batch basis makes it possible to readily recognize the correspondence between a portion of the simplified statement and the associated portion of the original.

Figure 16:
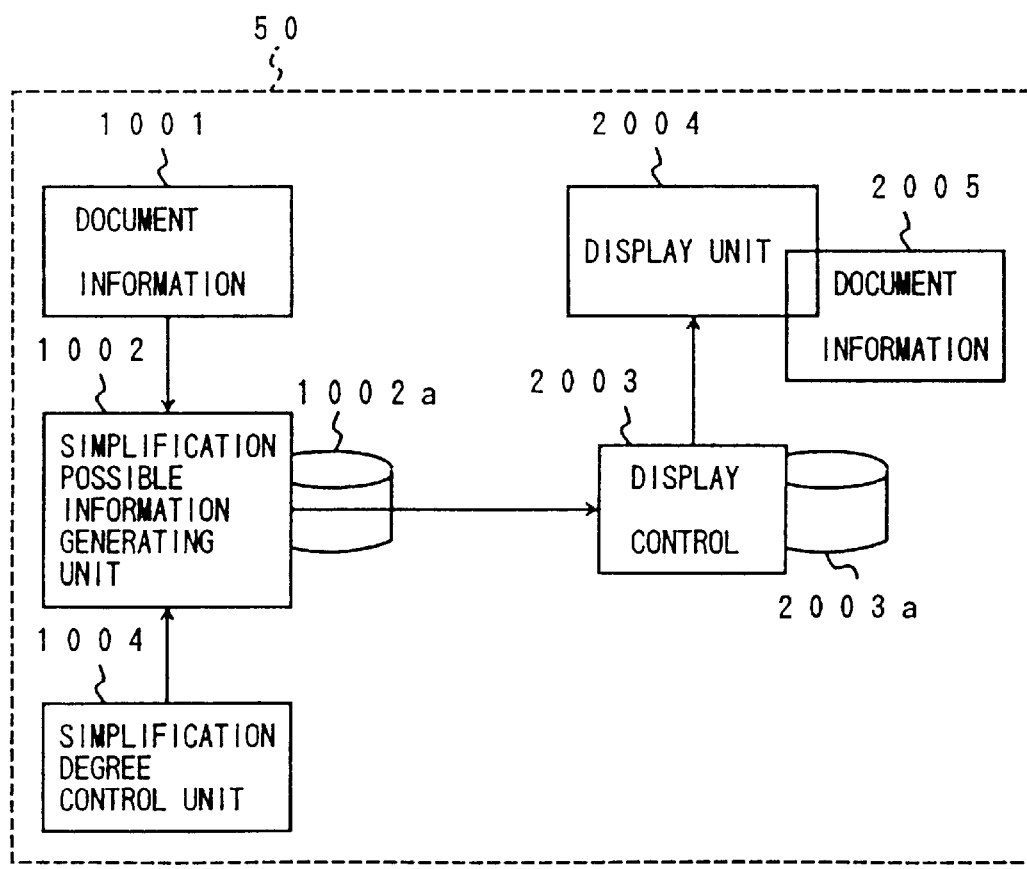
FIG. 16 is a functional block diagram of a document information processing apparatus according to one embodiment of the present invention.

FIG. 16 is a functional block diagram of a document information processing apparatus according to one embodiment of the present invention.

A document information processing apparatus 50 shown in FIG. 16 essentially corresponds to one in which the server 10 and the client 20 are combined to form a single apparatus. Forming a single apparatus may omit unnecessary blocks. In FIG. 16, the same parts are denoted by the same reference numbers as those of FIG. 10. And the redundant description will be omitted.

Forming a single apparatus may omit an insertion of the control character string. Thus, the simplification possible information generating unit 1002 directly transmits to the display control unit 2003 the simplification possible information together with the document information 1001 of the original. The display control unit 2003 produces the simplified statement directly from the original on the basis of the simplification possible information.

It is acceptable that the document information processing apparatus 50 shown in FIG. 16 is either the server itself or the client itself. In case of the client, however, there is a need that the document information processing apparatus 50 is provided with the text data base 1002a for generating the simplification possible information.

As described above, according to the present invention, even in the event that the character display capacity is poor, it is possible to compensate for the poor character display capacity by means of displaying high density of information.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A document information transmitting apparatus in a communication system having the document information transmitting apparatus for a transmission of document information and a document information receiving apparatus for receiving and displaying document information, said document information transmitting apparatus and said document information receiving apparatus being connected to each other through a communication line, said document information transmitting apparatus comprising:

a simplification possible portion detection unit detecting a portion, which can be simplified in sentence, of the document information, in accordance with meaning of sentences represented by the document information;

a control statement insertion unit inserting into the document information a control statement indicating a possible simplification in association with the portion, which can be simplified in sentence, of the document information;

a transmitter unit transmitting the document information including the control statement; and a simplification mode selection unit optionally selecting one of a plurality of simplification modes mutually different in degree of simplification, wherein said simplification possible portion detection unit detects the portion, which can be simplified in sentence, of the document information, in accordance with the simplification mode selected by said simplification mode selection unit.

2. A document information transmitting apparatus according to claim 1, further comprising a display capacity inquiry unit inquiring of the document information receiving apparatus of interest about its character display capacity, wherein said simplification mode selection unit selects, upon receipt of a response of the document information receiving apparatus of interest to inquiry of its character display capacity from said display capacity inquiry unit, the simplification mode according to the character display capacity of the document information receiving apparatus of interest.

3. A document information receiving apparatus in a communication system having the document information transmitting apparatus for a transmission of document information and a document information receiving apparatus for receiving and displaying document information, said document information transmitting apparatus and said document information receiving apparatus being connected to each other through a communication line, said document information receiving apparatus comprising:

a receiver unit receiving document information including a control statement indicating a possible simplification in association with a portion, which can be simplified in sentence, of the document information;

a simplification information generating unit generating simplification information in accordance with the document information including the control statement received with said receiver unit, said simplification information being simplified in the portion, which can be simplified in sentence, represented by the control statement;

a display unit, having a display screen, displaying on the display screen the simplification information generated by said simplification information generating unit;

an original information generating unit generating original information in which the control statement is removed from the document information including the control statement received with said receiver unit; and an information selecting unit for selecting either the simplification information generated by said simplification information generating unit or the original information generated by said original information generating unit, wherein said display unit displays on the display screen the simplification information selected by said information selecting unit.

4. A document information receiving apparatus according to claim 3, further comprising a handler indicating a position on the display screen of said display unit, wherein said information selecting unit is adapted to select either the simplification information or the original information every partial information mutually associated with each other in such a manner that when a display position, on the display screen, of the partial information simplified in the simplification information is indicated by said handler, said information selecting unit selects partial information of the original information associated with the partial information simplified in the simplification information instead of the partial information simplified in the simplification information.

5. A document information transmitting method in a communication system for transmission, receipt and display of document information, said document information transmitting method comprising the steps of:

detecting a portion, which can be simplified in sentence, of the document information, in accordance with meaning of sentences represented by the document information;

inserting into the document information a control statement indicating a possible simplification in association with the portion, which can be simplified in sentence, of the document information;

transmitting the document information including the control statement; and optionally selecting one of a plurality of simplification modes mutually different in degree of simplification, wherein said detecting step detects the portion, which can be simplified in sentence, of the document information, in accordance with the simplification mode selected.

6. A document information receiving method in a communication system for transmission, receipt and display of the document information, said document information receiving method comprising the steps of:

receiving document information including a control statement indicating a possible simplification in association with a portion, which can be simplified in sentence, of the document information;

generating simplification information in accordance with the document information including the control statement received, said simplification information being simplified in the portion, which can be simplified in sentence, represented by the control statement;

displaying the simplification information generated;

generating original information in which the control statement is removed from the document information including the control statement received; and selecting either the simplification information or the original information, wherein said displaying step displays the simplification information selected.

* * * * *